(12) United States Patent
Campana

(10) Patent No.: US 7,148,756 B2
(45) Date of Patent: *Dec. 12, 2006

(54) FEEDBACK SYSTEM TO CONTROL INTEGRATED CIRCUIT RESONANCE

(75) Inventor: Roger D. Campana, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 281 days.

This patent is subject to a terminal disclaimer.

(21) Appl. No.: 10/825,399

(22) Filed: Apr. 15, 2004

(65) Prior Publication Data

US 2004/0245963 A1 Dec. 9, 2004

Related U.S. Application Data

(63) Continuation-in-part of application No. 10/453,944, filed on Jun. 4, 2003.

(51) Int. Cl.
*H03L 7/00* (2006.01)

(52) U.S. Cl. ............... 331/16; 331/34; 310/316.01

(58) Field of Classification Search ............... 331/16, 331/34, 17; 310/316.01
See application file for complete search history.

(56) References Cited

U.S. PATENT DOCUMENTS 6,608,291 B1 * 8/2003 Collins et al. ............ 219/662

* cited by examiner

*Primary Examiner*—Arnold Kinkead
(74) *Attorney, Agent, or Firm*—Buckley, Maschoff & Talwalkar LLC

(57) ABSTRACT

According to some embodiments, a feedback circuit receives a signal, the signal corresponding to a proximity of an existing operation point of a system to a resonant operation point of the system, and determines if a self-impedance of the system should be changed based on the signal.

21 Claims, 6 Drawing Sheets

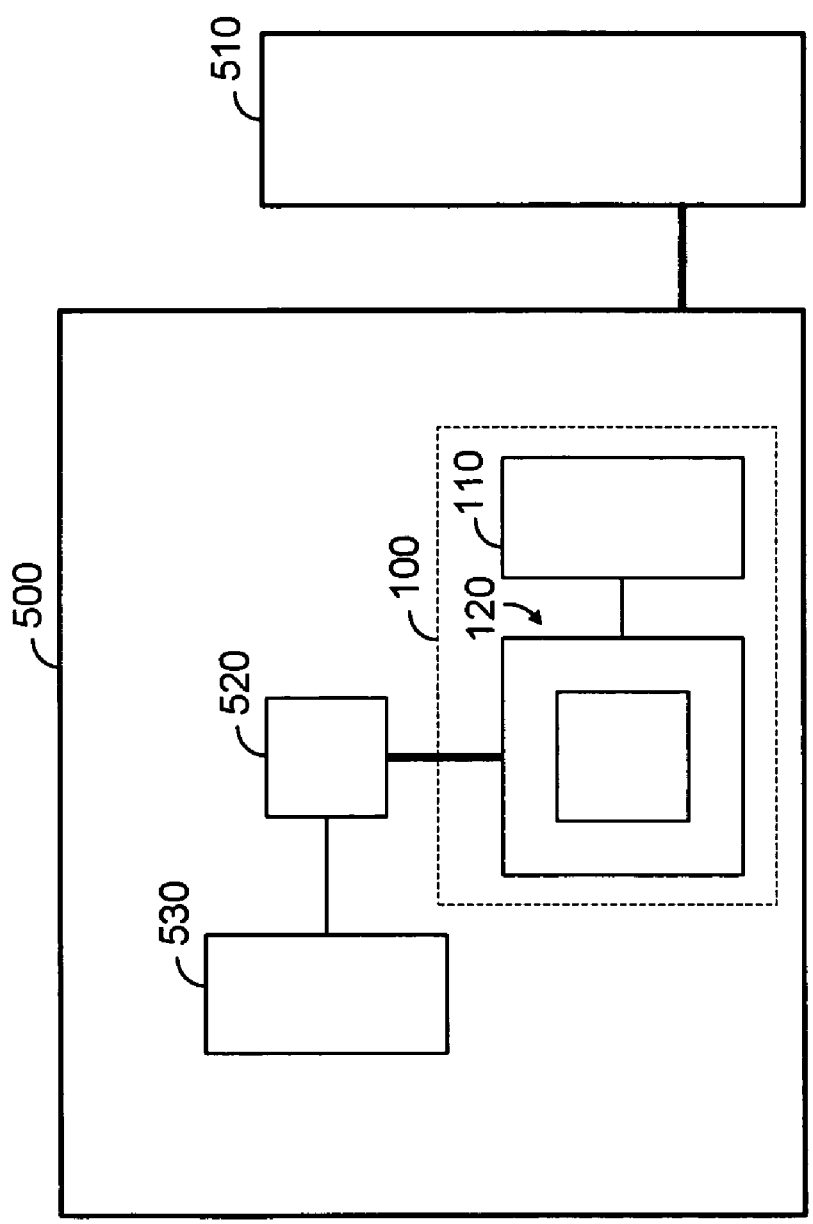

FEEDBACK SYSTEM TO CONTROL INTEGRATED CIRCUIT RESONANCE

CROSS-REFERENCE TO RELATED APPLICATIONS

This is a continuation-in-part of U.S. patent application No. 10/453,944, filed Jun. 4, 2003 and entitled "System To Control Integrated Circuit Resonance".

BACKGROUND

An integrated circuit often requires a constant supply voltage for proper operation. The supply voltage may be delivered by a power delivery circuit. Power transients in the delivery of the supply voltage may, at certain frequencies, cause the integrated circuit and the power delivery circuit to resonate. This resonance may quickly increase the amount of current drawn by the integrated circuit and may thereby cause the supply voltage to dip. As a result, proper operation of the integrated circuit may be compromised.

BRIEF DESCRIPTION OF THE DRAWINGS

FIG. 6 is a top view of a system according to some embodiments.

DETAILED DESCRIPTION

Figure 1:
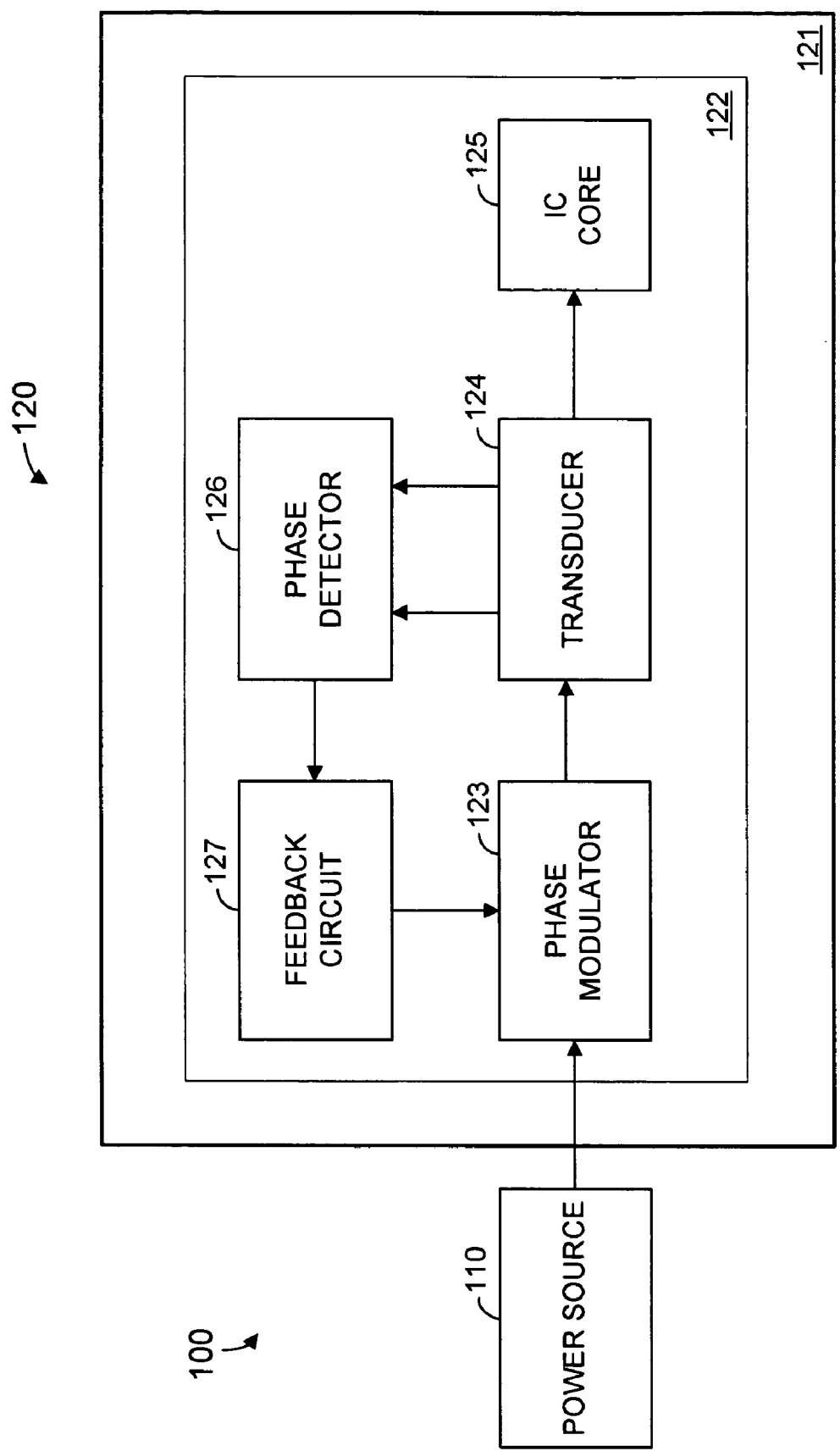
FIG. 1 is a block diagram of a system according to some embodiments.

FIG. 1 is a block diagram of system 100 according to some embodiments. System 100 includes power source 110 and integrated circuit package 120. System 100 may comprise any suitable power source and integrated circuit (IC) package. In some embodiments, system 100 comprises components of a desktop computing platform in which power source 110 comprises a voltage regulator and IC package 120 comprises a microprocessor.

Power source 110 may be physically separate from IC package 120, and may deliver power to electrical elements other than to IC package 120. According to some embodiments, power source 110 comprises a transformer to convert an input power signal (e.g., 120V @ 15A) to a power signal having a voltage and current value suitable for IC package 120.

IC package 120 comprises IC substrate 121 and IC die 122. IC substrate 121 may comprise any ceramic, organic, and/or other suitable material. Any currently- or hereafter-known IC substrate may be used in conjunction with some embodiments. According to some embodiments, IC substrate 121 comprises multiple stacked layers of dielectric material that are separated by planes of conductive traces. One plane of conductive traces may be coupled to one or more other planes of conductive traces by vias fabricated within the layers of dielectric material. Conductive traces of IC substrate 121 may carry power and I/O signals between elements of IC die 122 and external devices.

IC die 122 includes integrated electrical devices and may be fabricated using any suitable material and fabrication techniques. IC die 122 of FIG. 1 comprises phase modulator 123, transducer 124, IC core 125, phase detector 126, and feedback circuit 127. IC die 122 is coupled to substrate 121 using currently- or hereafter-known techniques such as, but not limited to, Controlled-Collapse Chip Connect (C4) and flip-chip techniques. Such techniques may allow a supply voltage to pass from power source 110 through IC substrate 121 and to phase modulator 123. In this regard, elements 123, 124, 126 and 127 may be disposed in parallel to IC core 125, which may include functional logic for providing the primary functionality of IC package 120.

Phase modulator 123 receives a supply voltage from power source 110 and transmits the supply voltage to transducer 124. Phase modulator 123 may control a self-impedance based on a signal received from feedback circuit 127. As will be described below, the self-impedance may be controlled to move an existing operation point of system 100 away from a resonant operation point.

Transducer 124 may receive a supply voltage from phase modulator 123, sense a supply current that is associated with the supply voltage and transmit the supply voltage and the supply current to phase detector 126. According to some embodiments, transducer 124 generates and transmits a voltage signal based on the sensed current. The current-based voltage signal may be proportional to and substantially in phase with the sensed current.

Based on the signals received from transducer 124, phase detector 126 then generates a signal that corresponds to a proximity of an existing operation point of system 100 and a resonant operation point of system 100. A resonant operation point may exist in a case that the supply voltage and the supply current are in phase. Accordingly, a proximity of an existing operation point to a resonant operation point may be determined by determining a phase difference between the supply current and the supply voltage. The closer the phase difference is to 0°, the closer the existing operation point of the circuit may be to the resonant operation point.

Figure 2:
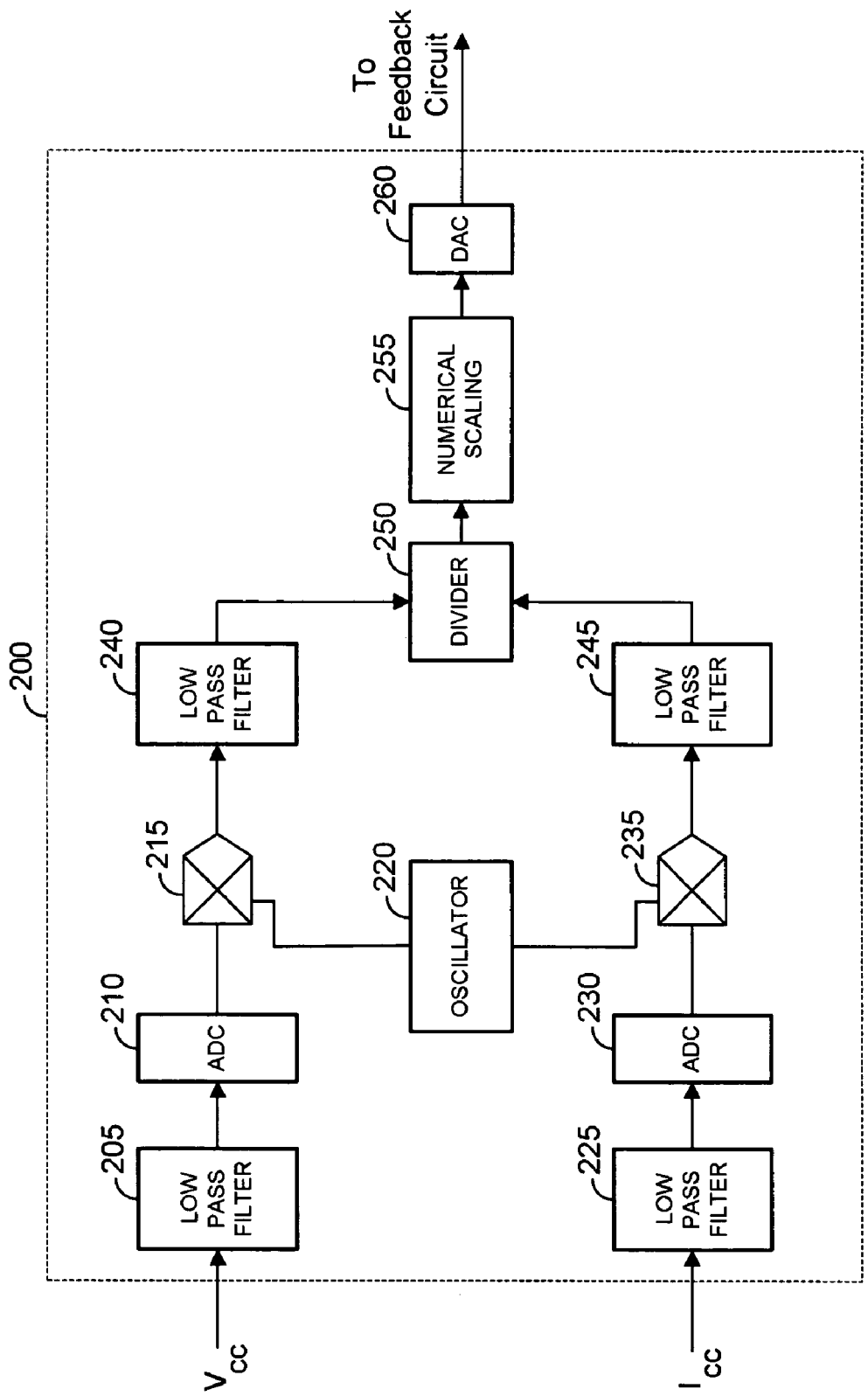
FIG. 2 is a block diagram of a phase detector according to some embodiments.

FIG. 2 is a block diagram of phase detector 200, which is one implementation of phase detector 126 according to some embodiments. Low-pass analog filter 205 of phase detector 200 receives the supply voltage from transducer 124. Low-pass analog filter 205 may limit a bandwidth of the supply voltage signal and output the bandwidth-limited supply voltage signal to analog-to-digital converter 210. Converter 210 then converts the signal to a digital supply voltage signal. Limiting the bandwidth of the supply voltage signal prior to the conversion may reduce aliasing during the conversion.

Modulator 215 receives the supply voltage signal from converter 210. Modulator 215 also receives a first oscillator signal from oscillator 220 and modulates the supply voltage signal in the digital domain to generate a modulated supply voltage signal. The first oscillator signal may comprise a digital representation of a sinusoidal signal. In some embodiments, a frequency of the sinusoidal signal may range from half the resonant frequency of IC package 121 to the actual resonant frequency.

Turning to the lower portion of control signal circuit 200, low-pass filter 225 receives the above-mentioned current-based voltage signal from transducer 124. As described above with respect to low-pass analog filter 205, low-pass analog filter 225 may limit a bandwidth of the current-based voltage signal to reduce aliasing during subsequent analog-to-digital conversion. Accordingly, low-pass analog filter 225 outputs the bandwidth-limited voltage signal to analogto-digital converter 230, which converts the signal to a digital current-based voltage signal.

Modulator 235 receives the current-based voltage signal from converter 230 and modulates the current-based voltage signal in the digital domain to generate a modulated current-based voltage signal. Modulator 235 modulates the current-based voltage signal based on a second oscillator signal received from oscillator 220. The second oscillator signal may be substantially identical to and −90° out of phase with the above-mentioned first oscillator signal. The second oscillator signal may therefore be described as "in quadrature" with the first oscillator signal.

The modulated supply voltage signal is filtered by low pass digital filter 240 to filter out high-frequency signal components. In one example, low pass digital filter 240 generates a binary representation of the modulated supply voltage signal in which amplitudes above a threshold value are represented by saturated bit values (e.g., 1111). Low pass digital filter 245 similarly filters the modulated current-based voltage signal output from modulator 235. Divider 250 receives the two signals and outputs a ratio signal having an amplitude that is equal to a ratio of an amplitude of the modulated supply voltage signal to an amplitude of the modulated current-based voltage signal.

According to some embodiments, the phase difference is inversely proportional to the ratio of an amplitude of the modulated current-based voltage signal to an amplitude of the modulated supply voltage signal. The phase difference may also be substantially equal to an arctangent of the ratio. The phrase "inversely proportional" as used herein merely implies a relationship between a first value and a second value in which an increase in the first value is reflected in a decrease in the second value. Magnitudes of the respective increases may be governed by any relationship, and might not be mathematically related.

Numerical scaling unit 255 may generate an output signal based on the ratio signal that is output by divider 250. Since the ratio signal indicates a phase difference between the supply voltage signal and the current-based voltage signal, the ratio signal also indicates a proximity of an existing operation point to a resonant operation point. Accordingly, numerical scaling unit 255 may perform any processing on the ratio signal that will result in a suitable input signal to feedback circuit 127.

According to some embodiments, numerical scaling unit 255 inverts the ratio signal to generate a voltage signal having an amplitude that is directly proportional to a phase difference between the supply voltage signal and the current-based voltage signal. "Directly proportional" as used herein implies a relationship between a first value and a second value in which an increase in the first value is reflected in an increase in the second value. Such an arrangement may generate a small-amplitude output signal if the phase difference is small and a larger-amplitude output signal in a case that the phase difference is larger. In some embodiments, numerical scaling unit may also or alternatively scale the ratio signal according to a desired range of signal amplitudes, and/or convert elements of the ratio signal to a desired bit-length.

Digital-to-analog converter 260 converts the digital output signal to an analog output signal. In a case that numerical scaling unit 255 inverts the ratio signal, a magnitude of the analog output signal is small in a case that the amplitude of the ratio signal is large. Moreover, the phase difference is small if the amplitude of the ratio signal is large and, an existing operation point is proximate to a resonant operation point in a case that the phase difference is small. Consequently, a magnitude of the analog output signal is small in a case that an existing operation point is proximate to a resonant operation point. A magnitude of the output signal is larger in a case that the existing operation point is not proximate to the resonant operation point. As mentioned above, some embodiments result in an analog output signal having a small magnitude in a case that the existing operation point is not proximate to the resonant operation point and a larger magnitude if the existing operation point is proximate to the resonant operation point.

Returning to FIG. 1, feedback circuit 127 may receive a signal from phase detector 126. The signal may be substantially proportional to a difference between a phase of a supply voltage and a phase of a supply current. The signal may also or alternatively correspond to a proximity of an existing operation point of system 100 to a resonant operation point of system 100. Feedback circuit 127 may then determine whether a self-impedance of IC package 120 should be changed based on the signal.

According to some embodiments, feedback circuit 127 compares the received signal to a threshold value, determines if the signal is negatively-sloped, and transmits the signal to an actuator such as phase modulator 123 to change the self-impedance of package 120 if the signal is below the threshold value and if the signal is negatively-sloped.

Figure 3:
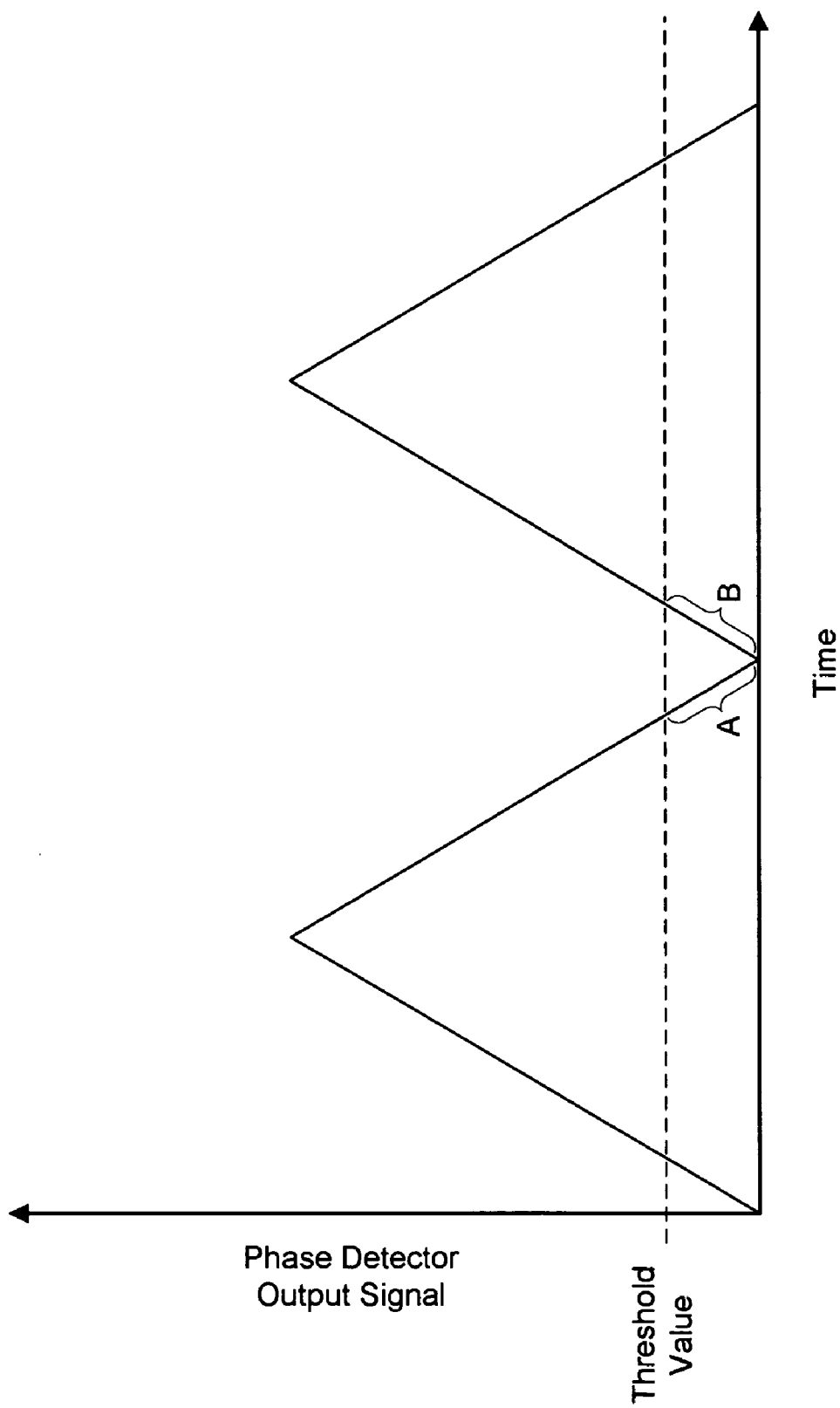
FIG. 3 is a graph of a phase difference over time according to some embodiments.

To explain the foregoing process, FIG. 3 is a graph of a rectified voltage signal that is output by phase detector 126 and received by feedback circuit 127 according to some embodiments. FIG. 3 assumes that a magnitude of a voltage signal output by phase detector 126 is directly proportional to a "distance" between an existing operation point and a resonant operation point. Accordingly, a magnitude of zero indicates that system 100 is operating at a resonant operation point. FIG. 3 includes a Threshold Value line that indicates a threshold voltage. Output signal voltages below the threshold voltage may correspond to operation points that are to be avoided because they are considered too close to a resonant operation point.

Therefore, feedback circuit 127 may determine whether a voltage of the received signal is less than the threshold voltage to determine whether the existing operation point is "too close" to a resonant operation point. Feedback circuit 127 may also determine if the voltage is negatively-sloping in order to determine whether the existing operation point is approaching the resonant operation point (e.g., portion A of FIG. 3) or moving away from the resonant operation point (e.g., portion B of FIG. 3). According to some embodiments, feedback circuit 127 does not transmit a signal to phase modulator 123 to change the self-impedance of IC package 120 if the existing operation point is moving away from the resonant operation point.

Feedback circuit 127 may receive a current signal from phase detector 126 according to some embodiments. A magnitude of the current may be directly proportional to a "distance" between an existing operation point and a resonant operation point. In some embodiments, a magnitude of a (current or voltage) signal received from phase detector 126 may be inversely proportional to a "distance" between an existing operation point and a resonant operation point. According to such embodiments, feedback circuit 127 may compare the received signal to a threshold value, determine if the signal is positively-sloped, and transmit the signal to an actuator such as phase modulator 123 to change the self-impedance of package 120 if the signal is greater than the threshold value and if the signal is positively-sloped.

Figure 4:
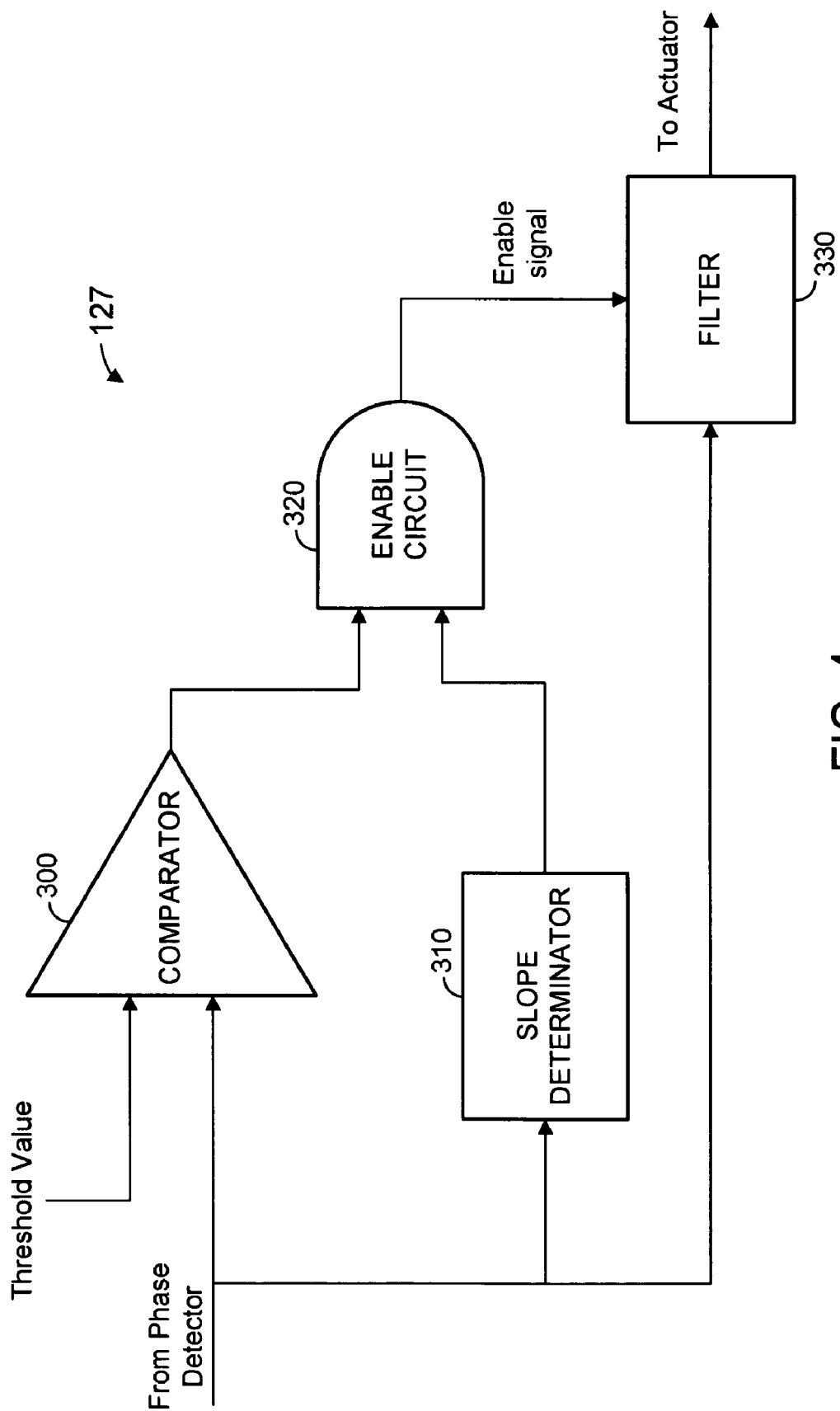
FIG. 4 is a block diagram of a feedback circuit according to some embodiments.

FIG. 4 is a block diagram of feedback circuit 127 according to some embodiments. Feedback circuit 127 of FIG. 4 comprises comparator 300, slope determinator 310, enable circuit 320 and filter 330. Feedback circuit 127 of FIG. 4 is configured to compare the received signal to a threshold value, determine if the signal is negatively-sloped, and transmit the signal to an actuator such as phase modulator 123 to change the self-impedance of package 120 if the signal is below the threshold value and if the signal is negatively-sloped.

In operation, comparator 300 receives the signal from phase detector 126 and a Threshold Value signal representing the Threshold Value line of FIG. 3. Comparator 300 outputs an active signal if the voltage (or current) associated with the signal from phase detector 126 is less than the voltage (or current) value indicated by the Threshold value signal.

Slope determinator 310 determines a slope of the signal received from phase detector 126 and outputs an active signal if the signal is negatively-sloped. Slope determinator 310 may comprise a differentiator to differentiate the received signal. According to some embodiments, the differentiated output of such a slope determinator may be inverted in order to input an active high signal to enable circuit 320 in a case that the signal is negatively-sloped.

Enable circuit 320 receives active signals from both comparator 300 and from slope determinator 310 in a case that the signal from phase detector 126 is below the threshold value and is negatively-sloped. In such a case, Enable circuit 320, which comprises an AND logic gate, transmits an active Enable signal to enable filter 330.

Filter 330 also receives the signal from phase detector 126. In a case that the Enable signal is active, filter 330 filters the signal from phase detector 126 based on input requirements of phase modulator 123. Filter 330 may then output the filtered signal to phase modulator 123 to change the self-impedance of IC package 120 based on the signal. Feedback circuit 127 of FIG. 4 may be altered to enable filter 330 and to transmit the signal to an actuator to change the self-impedance of package 120 if the signal is greater than the threshold value and if the signal is positively-sloped.

In some embodiments, phase modulator 123 receives the filtered signal and changes its self-impedance based thereon. The change will change a phase difference between the supply voltage and the supply current received from power source 110. The change may increase the phase difference in order to move an existing operation point of system 100 away from a resonant operation point.

Figure 5:
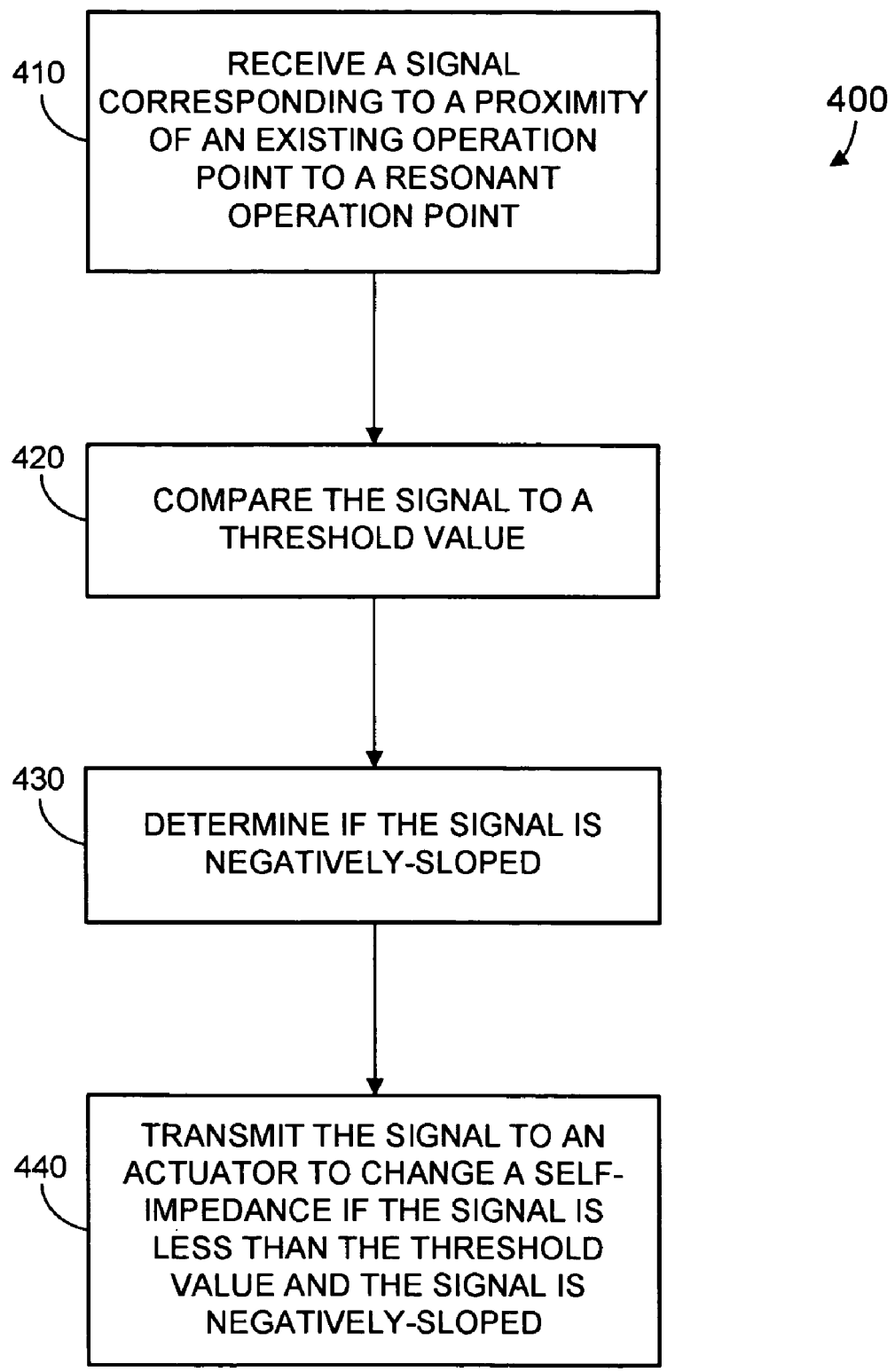
FIG. 5 is a flow diagram of a process according to some embodiments.

FIG. 5 is a flow diagram of process 400 according to some embodiments. Process 400 will be described below with respect to feedback circuit 127 of FIG. 4. However, process 400 may be executed by any combination of hardware, firmware and software.

Initially, at 410, a signal is received that corresponds to a proximity of an existing operation point to a resonant operation point. As described above, such a signal may be received by feedback circuit 127 from phase detector 126. Next, at 420, the signal is compared to a threshold value. Such a comparison may be effected by comparator 310 of FIG. 4, which outputs an active signal to enable circuit 320 if the signal is less than the threshold value.

It is determined, at 430, whether the received signal is negatively-sloped. Slope determinator 310 may differentiate the received signal to determine its slope in some embodiments of 430. Slope determinator 310 may also output an active signal to enable circuit 320 if the slope negative.

The received signal is transmitted to an actuator at 440 to change a self-impedance if the signal is less than the threshold value and the signal is negatively-sloped. Continuing with the present example, enable circuit 320 may enable filter 330 at 440 to transmit the signal to phase modulator 123 because both inputs of enable circuit 320 are high. As described above, filter 330 may filter the signal prior to transmission in accordance with input requirements of phase modulator 123.

FIG. 6 is a top view of the one implementation of system 100 according to some embodiments. The implementation may be incorporated into any number of larger systems, including but not limited to a desktop computer, a server, and a Personal Digital Assistant.

FIG. 6 shows system 100 mounted to motherboard 500. Also coupled to motherboard 500 is power supply 510, which may provide power to power source 110. Memory controller hub 520 and memory 530 are coupled to motherboard 500 for allowing IC package 120 to communicate with memory 530. Memory 510 may comprise any type of memory for storing data, such as a Single Data Rate Random Access Memory, a Double Data Rate Random Access Memory, or a Programmable Read Only Memory.

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

What is claimed is:

1. A method comprising:
   receiving a signal, the signal corresponding to a proximity of an existing operation point of a system to a resonant operation point of the system; and
   controlling a self-impedance of the system based on the signal,
   wherein the signal is substantially proportional to a difference between a phase of a supply voltage of the system and a phase of a supply current associated with the supply voltage.

2. A method comprising:
   receiving a signal, the signal corresponding to a proximity of an existing operation point of a system to a resonant operation point of the system; and
   controlling a self-impedance of the system based on the signal,
   wherein controlling the self-impedance of the system comprises:
   comparing the signal to a threshold value;
   determining if the signal is negatively-sloped; and
   transmitting the signal to an actuator to change the self-impedance if the signal is less than the threshold value and if the signal is negatively-sloped.

3. A method according to claim 2, wherein transmitting the signal comprises:
   enabling a filter if the signal is less than the threshold value and if the signal is negatively-sloped; and
   filtering the signal with the filter based on input requirements of the actuator.

4. A method comprising:
   receiving a signal, the signal corresponding to a proximity of an existing operation point of a system to a resonant operation point of the system; and
   controlling a self-impedance of the system based on the signal,
   wherein controlling the self-impedance of the system comprises:
   comparing the signal to a threshold value;
   determining if the signal is positively-sloped; and transmitting the signal to an actuator to change the self-impedance if the signal is greater than the threshold value and if the signal is positively-sloped.

5. A method according to claim 4, wherein transmitting the signal comprises:
enabling a filter if the signal is greater than the threshold value and if the signal is positively-sloped; and
filtering the signal with the filter based on input requirements of the actuator.

6. An apparatus comprising:
a feedback circuit to receive a signal, the signal corresponding to a proximity of an existing operation point of a system to a resonant operation point of the system, and to determine if a self-impedance of the system should be changed based on the signal; and
an actuator to control the self-impedance of the system, wherein the feedback circuit is to filter the signal based on input requirements of the actuator and to output the filtered signal to the actuator to control the self-impedance of the system based on the filtered signal.

7. An apparatus according to claim 6, the feedback circuit to:
filter the signal and output the filtered signal if the signal is less than the threshold value and if the signal is negatively-sloped.

8. An apparatus comprising:
a feedback circuit to receive a signal, the signal corresponding to a proximity of an existing operation point of a system to a resonant operation point of the system, and to determine if a self-impedance of the system should be changed based on the signal,
wherein the determination of whether the self-impedance of the system should be changed based on the signal comprises:
a determination that the signal is less than a threshold value; and
a determination that the signal is negatively-sloped.

9. An apparatus according to claim 8, further comprising:
an actuator to control the self-impedance of the system, wherein the feedback circuit is to:
enable a filter if the signal is less than the threshold value and if the signal is negatively-sloped;
filter the signal with the filter based on input requirements of the actuator; and
output the filtered signal to the actuator to control the self-impedance of the system based on the filtered signal.

10. An apparatus comprising:
a feedback circuit to receive a signal, the signal corresponding to a proximity of an existing operation point of a system to a resonant operation point of the system, and to determine if a self-impedance of the system should be changed based on the signal,
wherein the determination of whether the self-impedance of the system should be changed based on the signal comprises:
a determination that the signal is greater than a threshold value; and
a determination that the signal is positively-sloped.

11. An apparatus according to claim 10, further comprising:
an actuator to control the self-impedance of the system, wherein the feedback circuit is to:
enable a filter if the signal is greater than the threshold value and if the signal is positively-sloped;
filter the signal with the filter based on input requirements of the actuator; and output the filtered signal to the actuator to control the self-impedance of the system based on the filtered signal.

12. A circuit comprising:
a comparator to receive a threshold value, to receive a signal corresponding to a proximity of an existing operation point of a system to a resonant operation point of the system, and to output a comparator signal indicating whether the signal is less than the threshold value;
a slope determinator to receive the signal and to output a slope signal indicating whether the signal is negatively-sloped; and
a filter to receive the signal, the filter to filter the signal based on input requirements of an actuator and to output the filtered signal to the actuator if the signal is less than the threshold value and if the signal is negatively-sloped.

13. A circuit according to claim 12, further comprising:
an enable circuit to receive the comparator signal and the slope signal, and to output an enable signal to enable the filter if the comparator signal indicates that the signal is less than the threshold value and the slope signal indicates that the signal is negatively-sloped.

14. A circuit according to claim 12, the actuator to control the self-impedance of the system based on the filtered signal.

15. A circuit according to claim 14, the actuator to control the self-impedance of the system to move the existing operation point away from the resonant operation point.

16. A system comprising:
an integrated circuit comprising a feedback circuit to receive a signal, the signal corresponding to a proximity of an existing operation point of the integrated circuit to a resonant operation point of the integrated circuit, and to determine if a self-impedance of the integrated circuit should be changed based on the signal;
an actuator to control the self-impedance of the integrated circuit; and
a double data rate memory in communication with the integrated circuit,
wherein the feedback circuit is to filter the signal based on input requirements of the actuator and to output the filtered signal to the actuator to control the self-impedance of the integrated circuit based on the filtered signal.

17. A system comprising:
an integrated circuit comprising a feedback circuit to receive a signal, the signal corresponding to a proximity of an existing operation point of the integrated circuit to a resonant operation point of the integrated circuit, and to determine if a self-impedance of the integrated circuit should be changed based on the signal; and
a double data rate memory in communication with the integrated circuit,
wherein the determination of whether the self-impedance of the integrated circuit should be changed based on the signal comprises:
a determination that the signal is less than a threshold value; and
a determination that the signal is negatively-sloped.

18. A system according to claim 17, further comprising:
an actuator to control the self-impedance of the integrated circuit,
wherein the feedback circuit is to enable a filter if the signal is less than the threshold value and if the signal is negatively-sloped, filter the signal with the filter based on input requirements of an actuator, and output the filtered signal to the actuator to control the self-impedance of the integrated circuit based on the filtered signal.

19. An integrated circuit die comprising:

an integrated circuit core;

a feedback circuit to receive a signal, the signal corresponding to a proximity of an existing operation point of the integrated circuit die to a resonant operation point of the integrated circuit die, and to determine if a self-impedance of the integrated circuit die should be changed based on the signal; and an actuator to control the self-impedance of the integrated circuit die, wherein the feedback circuit is to filter the signal based on input requirements of the actuator and to output the filtered signal to the actuator to control the self-impedance of the integrated circuit die based on the filtered signal.

20. An integrated circuit die comprising:

an integrated circuit core; and a feedback circuit to receive a signal, the signal corresponding to a proximity of an existing operation point of the integrated circuit die to a resonant operation point of the integrated circuit die, and to determine if a self-impedance of the integrated circuit die should be changed based on the signal, wherein the determination of whether the self-impedance of the integrated circuit die should be changed based on the signal comprises:

a determination that the signal is less than a threshold value; and a determination that the signal is negatively-sloped.

21. An integrated circuit die according to claim 20, further comprising:

an actuator to control the self-impedance of the integrated circuit die, wherein the feedback circuit is to enable a filter if the signal is less than the threshold value and if the signal is negatively-sloped, filter the signal with the filter based on input requirements of an actuator, and output the filtered signal to the actuator to control the self-impedance of the integrated circuit die based on the filtered signal.

* * * * *